(12) United States Patent
Kim et al.

(10) Patent No.: US 8,007,644 B2
(45) Date of Patent: Aug. 30, 2011

(54) INCLINED CARRIER TRANSFERRING APPARATUS

(75) Inventors: Sung Eun Kim, Woolsan-si (KR); Tae Hyun Lim, Gumi-si (KR); Kwang Jong Yoo, Paju-si (KR); Byung Han Yun, Daegu-si (KR); Yang Sik Moon, Seoul (KR)

(73) Assignee: LG Display Co., Ltd., Seoul (KR)

( * ) Notice: Subject to any disclaimer, the term of this patent is extended or adjusted under 35 U.S.C. 154(b) by 1196 days.

(21) Appl. No.: 11/454,730

(22) Filed: Jun. 16, 2006

(65) Prior Publication Data

US 2006/0289306 A1   Dec. 28, 2006

(30) Foreign Application Priority Data

Jun. 22, 2005   (KR) .......................... 10-2005-0053987

(51) Int. Cl.
*C23C 14/34* (2006.01)
*C23C 16/00* (2006.01)

(52) U.S. Cl. .................. 204/298.15; 118/729; 414/217; 414/939; 198/836.1; 198/679; 198/805

(58) Field of Classification Search ............ 204/298.15; 118/729; 414/217, 939; 198/836.1, 679, 805
See application file for complete search history.

(56) References Cited

U.S. PATENT DOCUMENTS

| 4,892,451 | A | * | 1/1990 | Mahler ........................ 414/217 |
| 5,133,285 | A | * | 7/1992 | Mahler et al. ................ 118/719 |
| 5,909,995 | A | * | 6/1999 | Wolf et al. ................... 414/217 |
| 2006/0035021 | A1 | * | 2/2006 | Hartig ........................... 427/209 |

* cited by examiner

*Primary Examiner* — Rodney G McDonald
(74) *Attorney, Agent, or Firm* — Brinks Hofer Gilson & Lione

(57) ABSTRACT

An inclined carrier transferring apparatus for use inline sputtering equipment. The inclined carrier transferring apparatus includes rollers and a guiding portion. The rollers transfer and support the bottom of a carrier. The guiding portion is installed diagonally with respect to the rollers, to support the top of the carrier in a non-contact manner.

14 Claims, 6 Drawing Sheets

INCLINED CARRIER TRANSFERRING APPARATUS

CROSS-REFERENCE TO RELATED PATENT APPLICATION

This application claims the benefit of Korean Patent Application No. 10-2005-0053987, filed on Jun. 22, 2005, in the Korean Intellectual Property Office, the disclosure of which is incorporated herein by reference in its entirety.

FIELD OF THE INVENTION

The present invention relates to a substrate transferring apparatus for use in a sputtering apparatus, and more particularly, to an inclined carrier transferring apparatus for a sputtering equipment.

DESCRIPTION OF THE RELATED ART

In order to manufacture liquid crystal display devices (LCD) and other types of flat panel display devices, many thin film deposition, photolithography, and etching processes must be performed. Sputtering is generally used to deposit thin films, especially when forming a black matrix, a metal layer or a transparent electrode on the substrate.

Sputtering equipment for thin film deposition may be divided into cluster-type sputtering equipment and inline-type sputtering equipment, depending on how the chambers of the sputtering equipment are arranged.

In the cluster method, substrates are transported on a polygonal transfer chamber to other chambers. Since each of the chambers is independently operated, the substrate is not moved during a deposition process. In the in-line method, the chambers are aligned in a single row, and a carrier is used to move a substrate between chambers.

As shown in FIG. 1, inline type sputtering equipment includes a magazine 24 in which a carrier 23 (for containing a substrate) is loaded, a loader 22b on which carriers from the carrier magazine 24 are placed one by one, a robot 22a for transferring carriers from the loader 22b one by one, and a main body 25 for performing the actual deposition on each substrate moved individually by the loader 22b.

As shown in FIG. 2, the carrier 23 protects a substrate during processing thereof, and has a substrate-sized recess 32 formed in its central portion to receive a substrate. Thus, the entire sputtering process is performed with the substrate fitted into the recess 32 of the carrier 23. Because the carrier 23 may become contaminated with deposits after many sputtering processes, it should be replaced at regular intervals.

Because the sputtering equipment is spaced a predetermined distance apart from the equipment that performs the preceding processing stage, the substrate must be transported to the sputtering equipment from the preceding process after the process is completed to perform the sputtering process on the substrate. Accordingly, the carrier 23 may be used for thus transferring the substrate while preventing it from being damaged.

However, the carrier 23 has a large surface size and volume compared to a corresponding LCD panel. The relatively large size and volume of the carrier has been found to be a source of difficulty during the substrate manufacturing process. Also, because the carriers must be transported one at a time, the processing time increases and work efficiency of the manufacturing process accordingly decreases.

Referring to FIG. 3, the related art carrier transferring apparatus transfers a substrate in a vertical orientation that is placed in the recess 32 of the carrier 23.

Rollers 35 are provided for transferring the lower end of the carrier 23, which are driven to transfer the carrier 23 in a predetermined direction. When a carrier is maintained in a vertical orientation during transfer, there is no separate guiding line required or provided above the carrier so that there is little load thereon. This type of the carrier transferring apparatus has the disadvantage in that the central portion of the substrate tends to protrude outward due to the vertical orientation of the substrate, which may produce an uneven layer in the processed substrate.

Also, when the substrate is loaded on the carrier, it may be unstable. To improve the stability of the carrier 23, the lower support 34 of the carrier 23 must be heavy because the transferring operation solely relies on the rollers 35 at the lower end of the carrier.

SUMMARY OF THE INVENTION

Accordingly, the present invention is directed to an inclined carrier transferring apparatus, which substantially obviates one or more problems or disadvantages of the related art.

An object of the present invention is to provide an inclined carrier transferring apparatus that minimizes lateral movement of the carrier during the transferring operation.

Another object of the present invention is to provide an inclined carrier transferring apparatus that allows a substrate to be securely loaded on a carrier for the transferring operation.

A further object of the present invention is to provide an inclined carrier transferring apparatus that increases the evenness of a layer on a substrate.

To achieve these objects and other advantages and in accordance with the purpose of the invention, as embodied and broadly described herein, there is provided an inclined carrier transferring apparatus for an inline sputtering equipment, including: a transferable supporter for transferring and supporting a bottom of a carrier; and a guiding portion for supporting a top of the carrier in a non contacting manner.

The guiding portion may include a first magnetic end and a second magnetic end spaced a predetermined distance apart, and a third magnetic end disposed between the first and second magnetic ends and installed on a top of the carrier.

The third magnetic end may additionally be installed such that poles thereof face a same pole on the respective first magnetic end and the second magnetic end.

The third magnetic end may be installed such that it is repelled by both the first magnetic end and the second magnetic end.

The second magnetic end may have a stronger magnetic field than the first magnetic end.

The third magnetic end may be installed to have poles thereof aligned in a same direction as poles of one of the first magnetic end and the second magnetic end, and poles aligned in a different direction to the one of the first and second magnetic ends without the poles aligned in the same direction.

A gravitational force acting upon the carrier may be counteracted upon by a repelling force generated between the poles aligned in a different direction.

The transferable supporter may include a plurality of rollers positioned at the bottom of the carrier.

The guiding portion may be installed diagonally with respect to the rollers.

The transferable supporter may include a conveyer installed at the bottom of the carrier.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings. It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
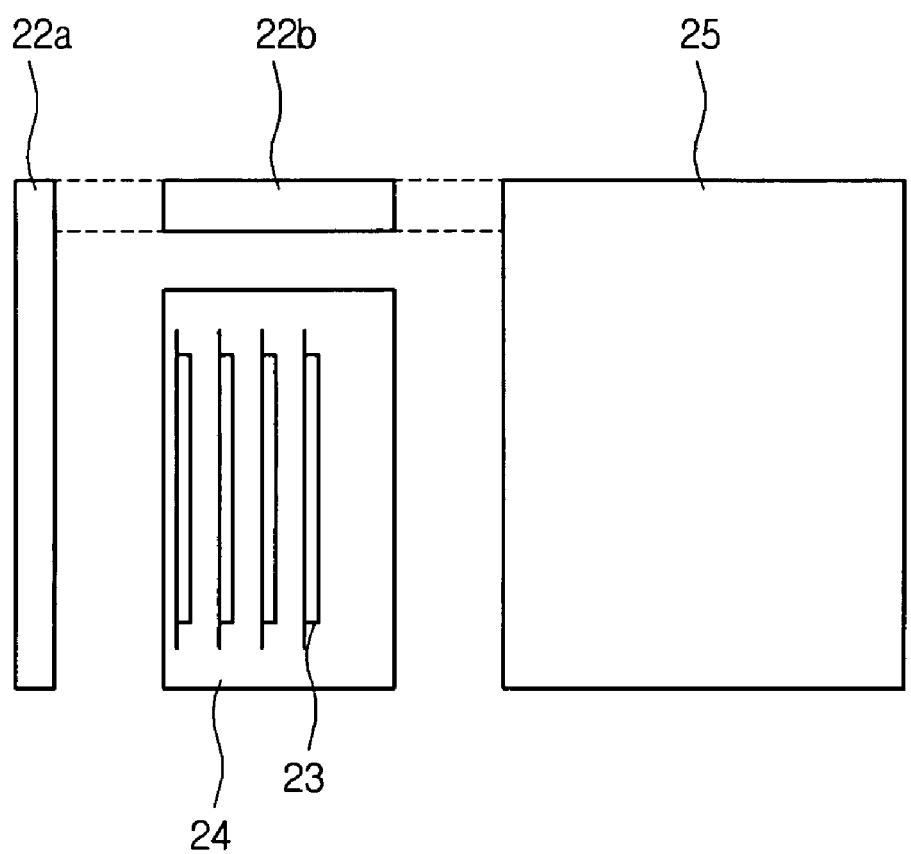
FIG. 1 is a schematic drawing of the overall structure of a related art inline sputtering equipment.
Figure 2:
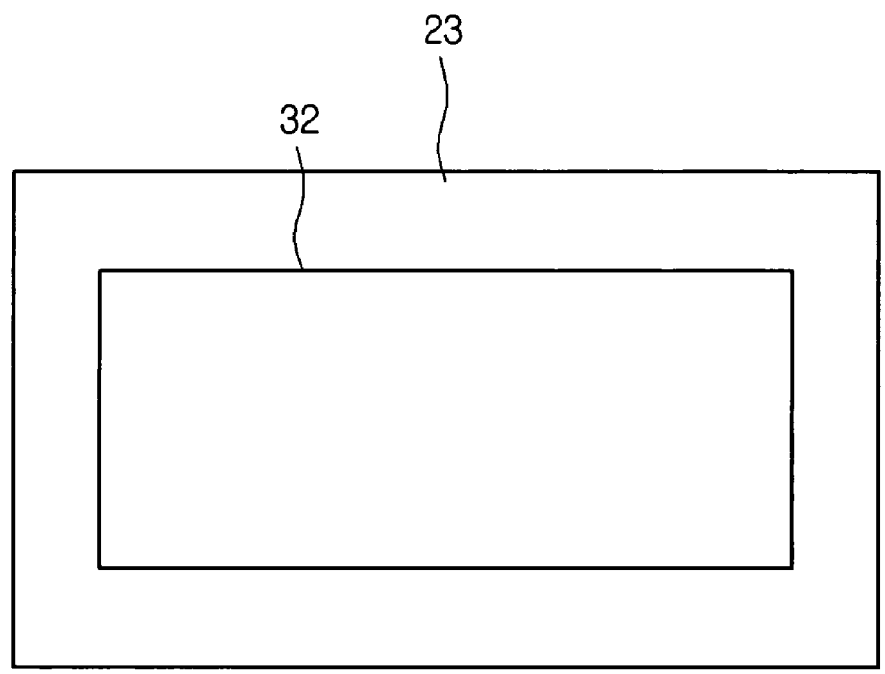
FIG. 2 is a schematic plan view of a carrier used in the related art inline sputtering equipment of FIG. 1.
Figure 3:
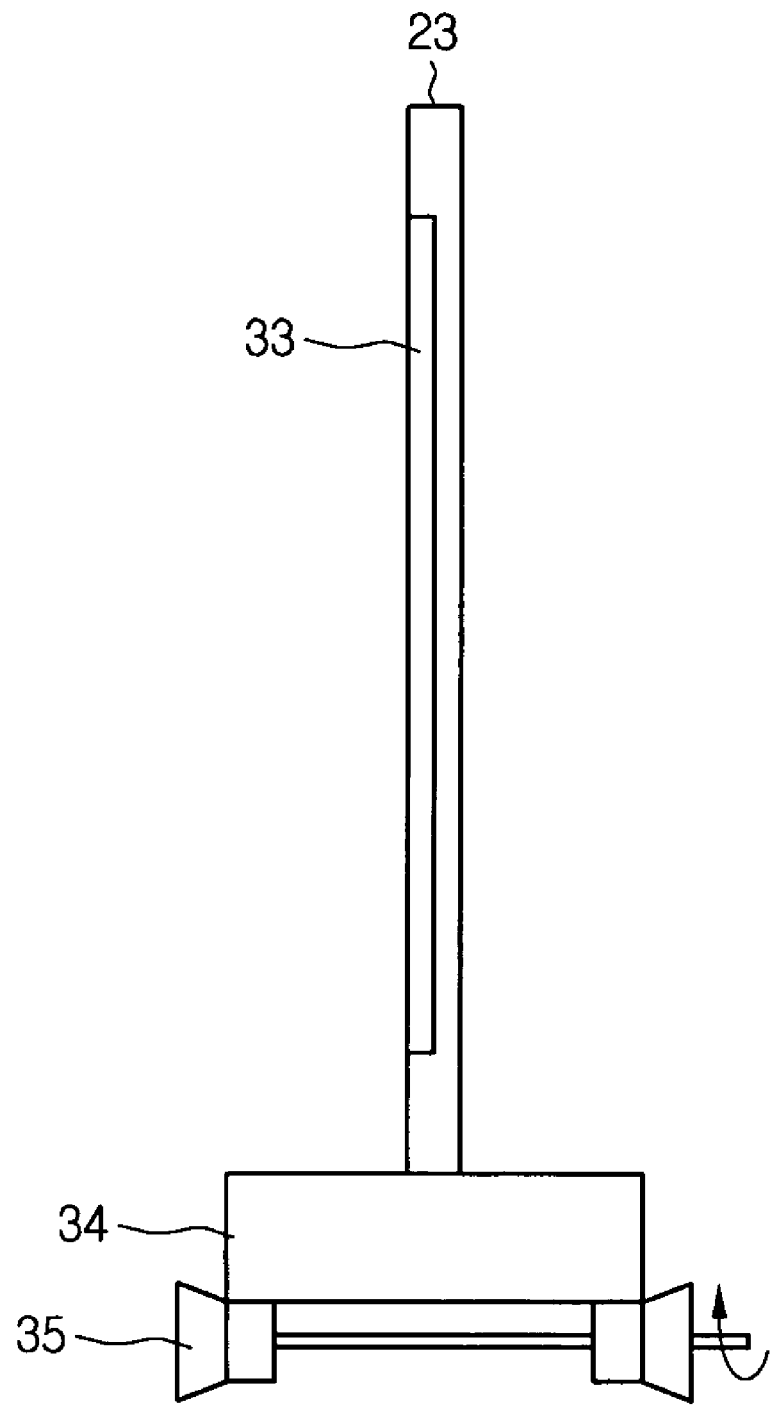
FIG. 3 is a side view of a related art carrier transferring apparatus of FIG. 1.
Figure 4:
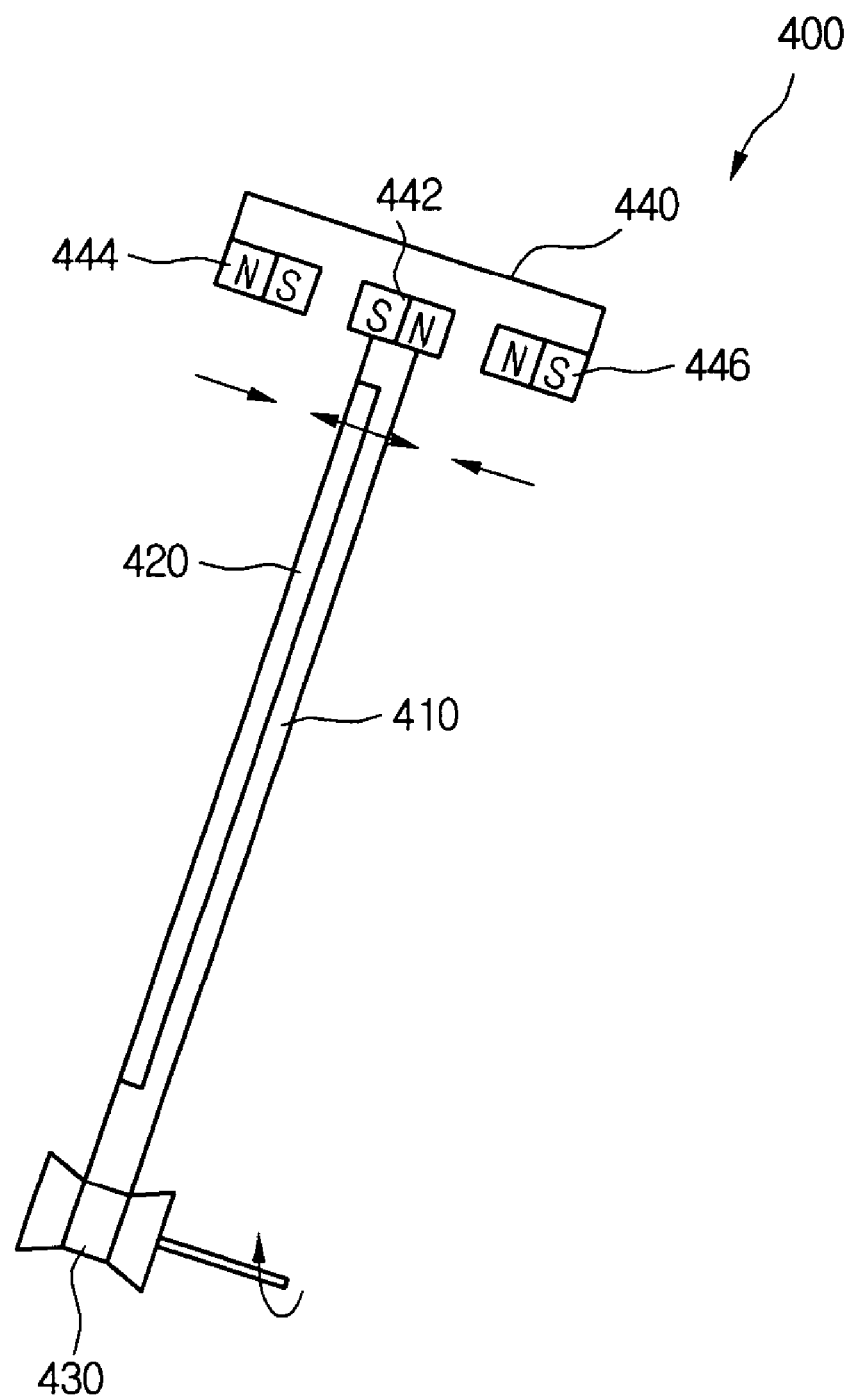
FIG. 4 is a schematic side view of an inclined carrier transferring apparatus according to an embodiment of the present invention.

Turning now to FIG. 4, a carrier transferring apparatus 400 is provided to transfer a carrier 410 tilted at a predetermined angle. The carrier 410 includes a recess that supports a substrate 420. Rollers 430 are disposed at a predetermined slant or incline and are provided at the lower portion of the carrier 410, in order to transfer the carrier 410. When the rollers 430 are driven, the carrier 410 is transferred in a specified direction. In other embodiments (not shown), the rollers 430 may be replaced with a conveyer including at least one belt.

By transferring the carrier 410 while the carrier 410 is positioned at an incline, the substrate 420 positioned on the carrier 410 is not transferred in a vertical orientation. Accordingly, the center of the substrate 420 does not protrude, bend, or buckle to create an unfavorable uneven surface on the substrate. Although the lower portion of the carrier 410 is supported by the rollers 430, the upper portion of the carrier 410 is supported by a guiding portion 440 to secure the carrier 410 as it is transferred.

The guiding portion 440 includes a first magnetic end 444 and a second magnetic end 446. The upper end of the carrier 410 is disposed in an empty center portion of the guiding portion 440. Additionally, a third magnetic end 442 is disposed on an upper end (or edge) the carrier 410.

The third magnetic end 442 of the guiding portion 440 is disposed between the first and second magnetic ends 444 and 446, with the north pole N and the south pole S of the third magnetic end 442 aligned such that the north pole N of the third magnet 42 faces the north pole N of the first magnetic end 444. Similarly, the south pole S of the third magnetic end 442 faces the south pole S of the second magnetic end 446. In other embodiments (not shown), the south pole S of the third magnetic end 442 faces the south pole S of the first magnetic end 444 and the north pole N of the third magnetic end 442 faces the north pole N of the second magnetic end N.

In other words, the south pole S of the first magnetic end 444 faces the south pole S of the third magnetic end 442, and the north pole N of the second magnetic end 446 faces the north pole N of the third magnetic end 442.

Accordingly, the third magnetic end 442 is repelled by the first and second magnetic ends 444 and 446 in opposite directions, so that an even force fixes the lateral position of the roller with respect to the first and second magnetic ends 444 and 446. The first, second, and third magnetic ends 444, 446 and 442 allow the carrier 410 to be securely transferred.

In some embodiments, the carrier 410 is inclined against the second magnetic end 446 during transfer and the weight of the carrier 410, is applied in the direction against the second magnetic end 446. In order to securely transfer the carrier 410 during processes where the carrier 410 is inclined, the second magnetic end 446 may be provided with a magnetic field strength greater than that of the first magnetic end 444. The guiding portion 440 has a first magnetic end 444 and a second magnetic end 446 with different magnetic field strengths to minimize lateral movement of the carrier 410 while transferring the carrier 410.

Here, in order to make the magnetic force of the second magnetic end 446 stronger than that of the first magnetic end 444, the magnetic material used for the respective ends may differ, or the dimensions of the magnets may differ to obtain the desired difference in the magnitude of the magnetic field produced by each of the magnets.

Figure 5:
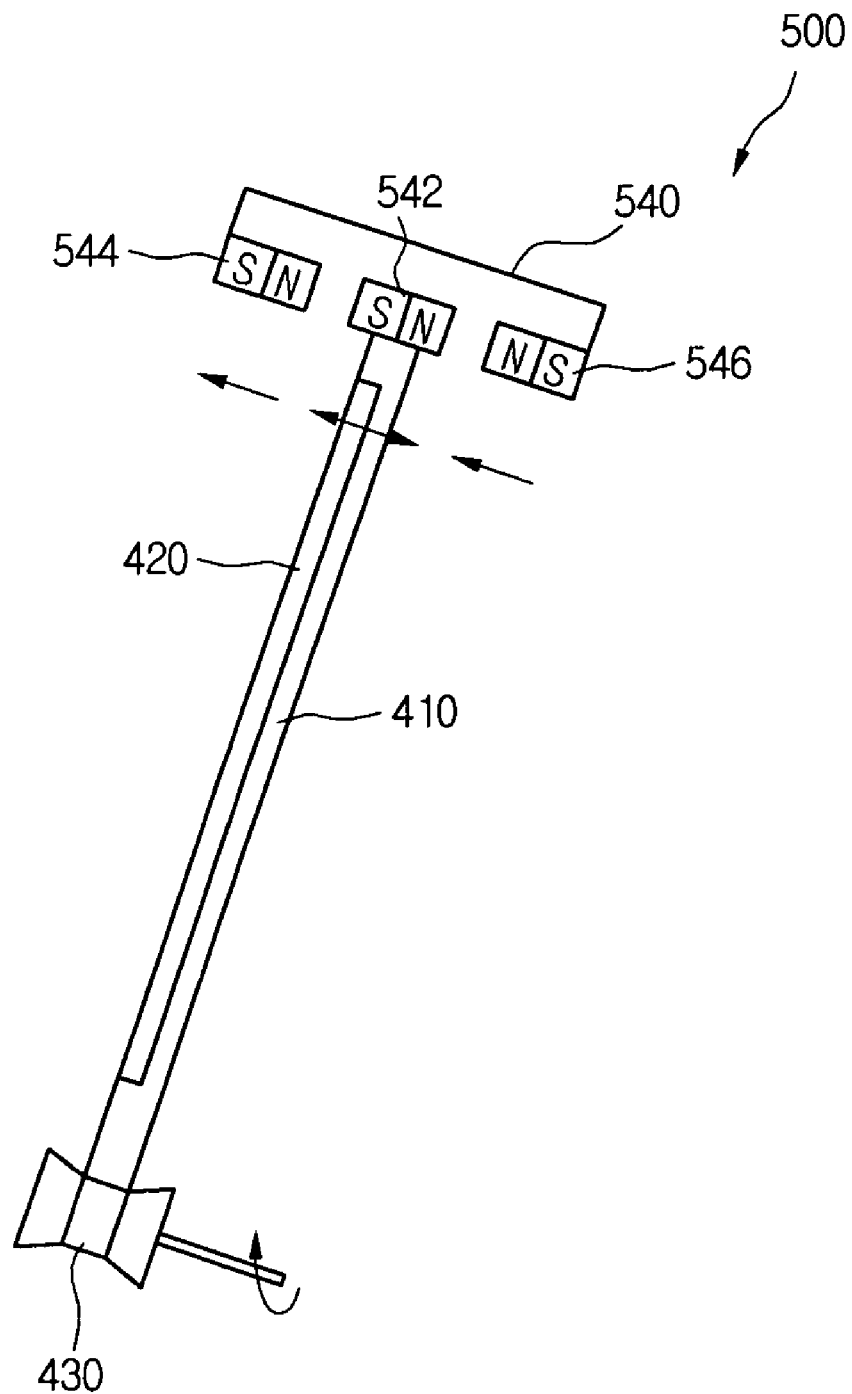
FIG. 5 is a schematic side view of another inclined carrier transferring apparatus according to another embodiment of the present invention.

FIG. 5 is a sectional view of an inclined carrier transferring apparatus according to another embodiment of the present invention. For the sake of brevity, components shown in FIG. 5 that include the same element numbers as those show in FIG. 4 and are discussed above will not be fully described again with respect to the following embodiments.

The inclined carrier transferring apparatus 500 according to an alternate embodiment includes a guiding portion 540 having a first magnetic end 544 and a second magnetic end. A carrier 410 is provided between the first and second magnetic ends 544, 546 and includes a third magnetic end 542 attached to an upper end (or edge) of the carrier 410. The third magnetic end 542 and the first magnetic end 544 are positioned such that the two magnetic ends 544 and 542 are magnetically attracted toward each other. For example, a north pole N of the first magnetic end 544 faces the south pole S of the third magnetic end 546. In other embodiments, the south pole S of the first magnetic end 544 may face the north pole N of the third magnetic end 542. The opposite pole of the third magnetic end 543 is positioned in proximity to the pole of the same magnetic polarity of the second magnetic end 546. For example, when the north pole N of the third magnetic end 542 faces the south pole S of the first magnetic end 544, the south pole S of the third magnetic end 542 faces the corresponding south pole S of the second magnetic end 546.

In other words, the north pole N of the first magnetic end 544 faces the south pole S of the third magnetic end 542, and the north pole N of the second magnetic end 546 faces the north pole N of the third magnetic end 542.

Therefore, the third magnetic end 542 is repelled by the magnetic repulsion of the first and second magnetic ends 544 and 546 that act in a direction opposite to the direction of gravity to provide a steady force that fixes the carrier in an inclined position. Accordingly, the carrier 410 with the third magnetic end 542 provided at a top end can be securely transferred in an inclined position.

In other words, when the carrier 410 is transferred while it is tilted toward the second magnetic end 546, the weight of the carrier 410 is exerted toward the second magnetic end 546. In order to securely transfer the carrier 410, the first and second magnetic ends 544 and 546, exert attracting and repelling forces on the third magnetic end 542, respectively to oppose the gravitational force upon the carrier 410 and maintain the carrier 410 at a steady incline while it is transferred.

The carrier 410 may be transferred by the inclined carrier transferring apparatus toward the sputtering equipment, and the carrier holding the substrate enters the main portion of the sputtering equipment to perform thin film deposition.

Figure 6:
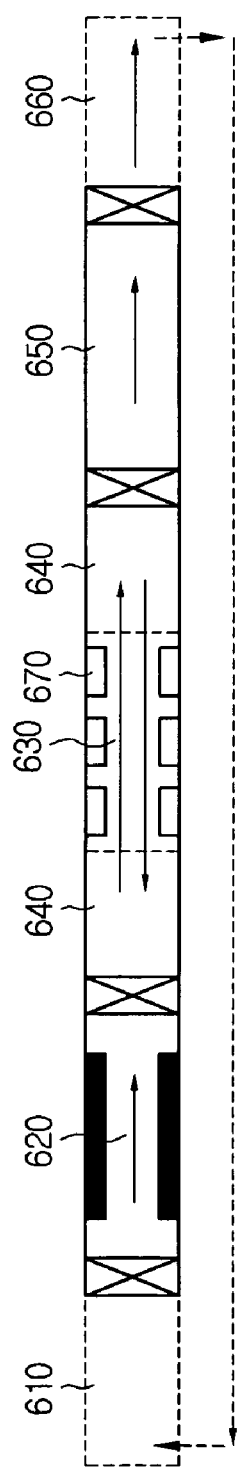
FIG. 6 is a schematic view of a thin film deposition process.

As shown in FIG. 6, a main body for inline sputtering includes a loader 610 for transferring the substrate into the main body, a heating chamber 620 for heating the substrate to a desired temperature and improving adhesiveness of metals, a process chamber 630 for sputtering operations, a buffer chambers 640 provided on either end within the process chamber 630, a cooling chamber 650 for cooling a sputtered substrate, and an unloader 660. All of the previously described chambers are normally arranged in a single line. The inside of the main body is normally maintained at a constant state of cleanliness.

If the substrate that has been cooled in the cooling chamber 650 needs to undergo a further process or have other metals deposited thereon, it reenters the loader 610 and repeats the process. The buffer chamber 640 at either end of the process chamber 630 is installed to negate the differences in pressure between the process chamber 630 and adjacent chambers. The above main body processes substrates continuously, and transferring rollers are used to transfer the substrates through each of the chambers.

The present invention employs driving rollers angled at a predetermined slant at the bottom of a carrier, and a non-contacting magnetic guide at the top of the carrier, so that the carriers may be transferred with minimal lateral movement, which provides for safe loading of substrates and increases the evenness of the layers.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An inclined carrier transferring apparatus for use with inline sputtering equipment, comprising:
    a carrier includes a recess that supports a substrate;
    a transferable supporter for transferring and supporting a bottom of the carrier; and
    a guiding portion disposed such that it supports a top portion of the carrier without contacting the guiding portion,
    wherein the carrier is tilted at a predetermined angle,
    wherein the transferable supporter includes a plurality of rollers positioned at the bottom of the carrier, the guiding portion is installed diagonally with respect to the rollers,
    wherein the guiding portion includes a first magnetic end and a second magnetic end spaced a predetermined distance apart from the first magnetic end, and a third magnetic end attached to the top portion of the carrier and disposed between the first and second magnetic ends,
    wherein the second magnetic end has a stronger magnetic force than the first magnetic end,
    wherein the first magnetic end and the second magnetic end respective has different materials or different dimensions.

2. The inclined carrier transferring apparatus according to claim 1, wherein the third magnetic end is installed such that the poles of the third magnetic end face a corresponding magnetic pole on the respective first magnetic end and the second magnetic end.

3. The inclined carrier transferring apparatus according to claim 1, wherein the third magnetic end is installed such that it is repelled by both the first magnetic end and the second magnetic end.

4. The inclined carrier transferring apparatus according to claim 1, wherein the third magnetic end is attached to the carrier such that the magnetic poles on the third magnetic end are aligned in a same direction as the magnetic pole of one of the first magnetic end and the second magnetic end, and the magnetic pole aligned in the opposite direction to the other of the first and second magnetic ends.

5. The inclined carrier transferring apparatus according to claim 4, wherein a gravitational force acting upon the carrier is counteracted upon by a repelling force generated between the poles of the third magnetic end and the one of the first or the second magnetic end.

6. The inclined carrier transferring apparatus according to claim 1, wherein the transferable supporter includes a conveyer installed at the bottom of the carrier.

7. An apparatus for transferring a carrier loaded with a substrate comprising:
    a carrier includes a recess that supports a substrate;
    a transferable supporter for supporting transferably a bottom end of the carrier;
    first and second magnetic ends provided to align a top end of the carrier; and
    a third magnetic end positioned to interact with the first and second magnetic ends, on the top end of the carrier,
    wherein the carrier is tilted at a predetermined angle,
    wherein the transferable supporter includes a plurality of rollers positioned at the bottom of the carrier, the guiding portion is installed diagonally with respect to the rollers,
    wherein the second magnetic end has a stronger magnetic force than the first magnetic end,
    wherein the first magnetic end and the second magnetic end respective has different materials or different dimensions.

8. The apparatus of claim 7, wherein the first, second, and third magnetic ends each include respective north and south poles.

9. The apparatus of claim 8, wherein the top end of the carrier is positioned such that the north pole of the third magnetic end is in the proximity of the north pole of the first magnetic end and the south pole of the third magnetic end is in the proximity of the south pole of the second magnetic end.

10. The apparatus of claim 7, wherein the carrier is oriented at an inclined angle with respect to the direction of motion of the carrier along the plurality of rollers.

11. The apparatus of claim 10, wherein a portion of the first magnetic end is positioned above a portion of the third magnetic end and a portion of the third magnetic is positioned above a portion of the second magnetic end.

12. The apparatus of claim 11, wherein the north pole of the third magnetic end is in proximity to the north pole of the second magnetic end and the south pole of the third magnetic end is in proximity to the north pole of the first magnetic end.

13. The apparatus of claim 7, the first and second magnetic ends are installed diagonally with respect to the rollers.

14. The apparatus of claim 7, wherein the transferable supporter includes a conveyer installed at the bottom of the carrier.

\* \* \* \* \*